United States Patent
Matsuki et al.

(10) Patent No.: US 6,352,945 B1
(45) Date of Patent: Mar. 5, 2002

(54) SILICONE POLYMER INSULATION FILM ON SEMICONDUCTOR SUBSTRATE AND METHOD FOR FORMING THE FILM

(75) Inventors: Nobuo Matsuki; Yuichi Naito; Yoshinori Morisada; Aya Matsunoshita, all of Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/326,847

(22) Filed: Jun. 7, 1999

(30) Foreign Application Priority Data

Feb. 5, 1998 (JP) ............................. 10-037929

(51) Int. Cl.⁷ ............................. H01L 21/31
(52) U.S. Cl. ................. 438/778; 438/780; 438/623; 438/763
(58) Field of Search ................. 438/780, 763, 438/778, 623

(56) References Cited

U.S. PATENT DOCUMENTS

| | | |
|---|---|---|
| 5,314,724 A | 5/1994 | Tsukune et al. |
| 5,380,555 A | 1/1995 | Mine et al. |
| 5,433,786 A | 7/1995 | Hu et al. |
| 5,494,712 A | 2/1996 | Hu et al. |
| 5,554,570 A | 9/1996 | Maeda et al. |
| 5,989,998 A | 11/1999 | Sugahara et al. |
| 6,051,321 A | 4/2000 | Lee et al. |
| 6,054,379 A | 4/2000 | Yau et al. |
| 6,068,884 A | 5/2000 | Rose et al. |
| 6,242,339 B1 * | 6/2001 | Aoi ............................. 438/623 |

FOREIGN PATENT DOCUMENTS

| | | |
|---|---|---|
| EP | 0 826 791 A2 | 3/1998 |
| JP | 10-284486 | 10/1998 |

* cited by examiner

Primary Examiner—Richard Elms
Assistant Examiner—Beth E. Owens
(74) Attorney, Agent, or Firm—Knobbe, Martens, Olson & Bear, LLP

(57) ABSTRACT

A method for forming a silicone polymer insulation film having a low relative dielectric constant, high thermal stability and high humidity-resistance on a semiconductor substrate is applied to a plasma CVD apparatus. The first step is introducing a silicon-containing hydrocarbon compound expressed by the general formula $Si_\alpha O_\beta C_x H_y$ ($\alpha$, $\beta$, x, and y are integers) to the reaction chamber of the plasma CVD apparatus. The silicon-containing hydrocarbon compound has at most two $O-C_nH_{2n+1}$ bonds and at least two hydrocarbon radicals bonded to the silicon. The residence time of the material gas is lengthened by, for example, reducing the total flow of the reaction gas, in such a way as to form a silicone polymer film having a micropore porous structure with a low relative dielectric constant.

12 Claims, 3 Drawing Sheets

SILICONE POLYMER INSULATION FILM ON SEMICONDUCTOR SUBSTRATE AND METHOD FOR FORMING THE FILM

BACKGROUND OF THE INVENTION

1. Field of the Invention

This invention relates generally to a semiconductor technique and more particularly to a silicone polymer insulation film on a semiconductor substrate and a method for forming the film by using a plasma CVD (chemical vapor deposition) apparatus.

2. Description of Related Art

Because of the recent rise in requirements for the large-scale integration of semiconductor devices, a multi-layered wiring technique attracts a great deal of attention. In these multi-layered structures, however, capacitance among individual wires hinders high speed operations. In order to reduce the capacitance it is necessary to reduce the relative dielectric constant of the insulation film. Thus, various materials having a relatively low relative dielectric constant have been developed for insulation films.

Conventional silicon oxide films $SiO_x$ are produced by a method in which oxygen $O_2$ or nitrous oxide $N_2O$ is added as an oxidizing agent to a silicon material gas such as $SiH_4$ or $Si(OC_2H_5)_4$ and then processed by heat or plasma energy. Its relative dielectric constant is about 4.0.

Alternatively, a fluorinated amorphous carbon film has been produced from $C_xF_yH_z$ as a material gas by a plasma CVD method. Its relative dielectric constant $\in$ is as low as 2.0–2.4.

Another method to reduce the relative dielectric constant of an insulation film has been made by using the good stability of Si—O bond. A silicon-containing organic film is produced from a material gas under low pressure (1 Torr) by the plasma CVD method. The material gas is vaporized P-TMOS (phenyl trimethoxysilane, formula 1), which is a compound of silicon bonded to a phenyl group. The relative dielectric constant $\in$ of this film is as low as 3.1.

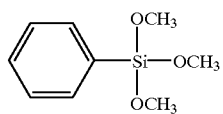

(1)

A futer method uses a porous structure made in the film. An insulation film is produced from an inorganic SOG (spin-on glass) material by a spin-coat method. The relative dielectric constant $\in$ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the relative dielectric constant of the film cannot be reduced to a desired degree.

Further, the SOG insulation film of the spin-coat method has a problem in which a cure system after the coating process is costly.

OBJECTS OF THE INVENTION

It is, therefore, a principal object of this invention to provide an improved insulation film and a method for forming it.

It is another object of this invention to provide an insulation film that has a low relative dielectric constant, high thermal stability, high humidity-resistance and high oxygen plasma resistance, and a method for forming it.

It is a further object of this invention to provide a material for forming an insulation film that has a low relative dielectric constant, high thermal stability, high humidity-resistance and high $O_2$ plasma resistance.

It is a still further object of this invention to provide a method for easily forming an insulation film that has a low relative dielectric constant without requiring an expensive device.

SUMMARY OF THE INVENTION

One aspect of this invention involves a method for forming an insulation film on a semiconductor substrate by using a plasma CVD apparatus including a reaction chamber, which method comprises a step of introducing a material gas of a silicon-containing hydrocarbon compound expressed by the general formula $Si_\alpha O_\beta C_x H_y$ ($\alpha$, $\beta$, x, and y are integers) to the reaction chamber of the plasma CVD apparatus, and a step of forming an insulation film on a semiconductor substrate by a plasma polymerization reaction wherein mixed gases made from the gaseous silicon-containing hydrocarbon compound is used as a reaction gas. It is a remarkable feature that the residence time of the material gas in the reaction chamber is lengthened. According to the present invention, a silicone polymer film having a micropore porous structure with low relative dielectric constant can be produced. In the above, plasma CVD includes CVD excited by microwave.

The present invention is also drawn to an insulation film formed on a semiconductor substrate, and a material for forming the insulation film, residing in the features described above.

DETAILED DESCRIPTION OF THE PREFERRED EMBODIMENTS OF THE INVENTION

Basic Aspects

Figure 1:
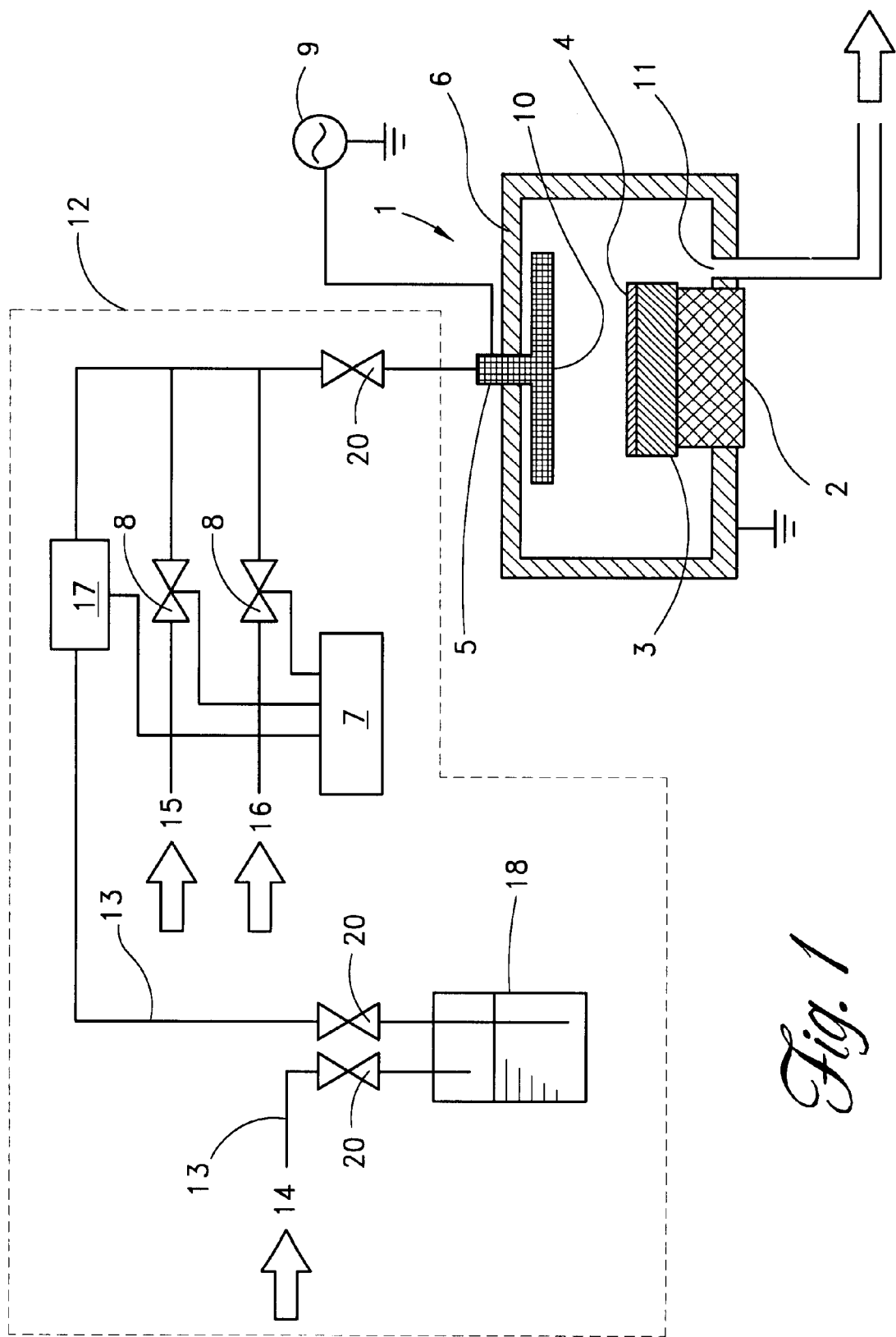
FIG. 1 is a schematic diagram illustrating a plasma CVD apparatus used for forming an insulation film of this invention.

In the present invention, the silicon-containing hydrocarbon compound expressed as the general formula $Si_\alpha O_\beta C_x H_y$ (α, β, x, and y are integers) is preferably a compound having at least one Si—O bond, two or less O—$C_nH_{2n+1}$ bonds and at least two hydrocarbon groups bonded with silicon (Si). More specifically, the silicon-containing hydrocarbon compound includes at least one species of the compound expressed by the chemical formula (2) as follows:

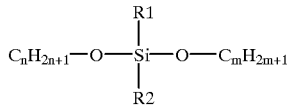

(2)

wherein R1 and R2 are one of $CH_3$, $C_2H_3$, $C_2H_5$, $C_3H_7$ and $C_6H_5$, and m and n a any integer.

Except for the species indicated above, the silicon-containing hydrocarbon compound can include at least one species of the compound expressed by the chemical formula (3) as follows:

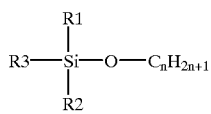

(3)

wherein R1, R2 and R3 are one of $CH_3$, $C_2H_3$, $C_2H_5$, $C_3H_7$ and $C_6H_5$, and integer.

Except for those species indicated above, the silicon-containing hydrocarbon compound can include at least one species of the compound expressed by the chemical formula (4) as follows:

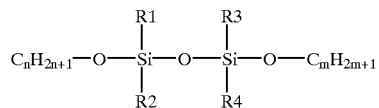

(4)

wherein R1, R2, R3 and R4 are one of $CH_3$, $C_2H_3$, $C_2H_5$, $C_3H_7$ and $C_6H_5$, and m and n are any integer.

Further, except for those species indicated above, the silicon-containing hydrocarbon compound can include at least one species of the compound expressed by the chemical formula (5) as follows:

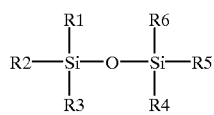

(5)

wherein R1, R2, R3, R4, R5 and R6 are one of $CH_3$, $C_2H_3$, $C_2H_5$, $C_3H_7$ and $C_6H_5$.

Furthermore, except for those species indicated above, the silicon-containing hydrocarbon compound can include at least one species of the compound expressed by the chemical formula (6) as follows:

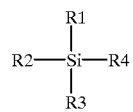

(6)

wherein R1, R2, R3 and R4 are one of $CH_3$, $C_2H_3$, $C_2H_5$, $C_3H_7$ and $C_6H_5$.

Still further, the material gas can include at least one of said silicon-containing hydrocarbon compounds indicated above.

In accordance with another aspect of this invention, an insulation film is formed on a substrate and the film is polymerized with plasma energy in a plasma CVD apparatus by using a material gas including a silicon-containing hydrocarbon compound expressed by formula 2.

Additionally, the insulation film is formed on a substrate and the film is polymerized with plasma energy in a plasma CVD apparatus by using a material gas including a silicon-containing hydrocarbon compound expressed by formula 3.

Further, the insulation film is formed on a substrate and the film is polymerized with plasma energy in a plasma CVD apparatus by using a material gas including a silicon-containing hydrocarbon compound expressed by formula 4.

Furthermore, the insulation film is formed on a substrate and the film is polymerized with plasma energy in a plasma CVD apparatus by using a material gas including a silicon-containing hydrocarbon compound expressed by formula 5.

Still further, the insulation film is formed on a substrate and the film is polymerized with plasma energy in a plasma CVD apparatus by using a material gas including a silicon-containing hydrocarbon compound expressed by formula 6.

In accordance with a further aspect of this invention, a material for forming an insulation film is supplied in a vapor phase in the vicinity of a substrate and is treated in a plasma CVD apparatus to form the insulation film on the substrate by chemical reaction, and the material is further expressed by formula 2.

Additionally, a material for forming an insulation film is supplied in a vapor phase in the vicinity of a substrate and is treated in a plasma CVD apparatus to form the insulation film on the substrate by chemical reaction, and the material is further expressed by formula 3.

Further, a material for forming an insulation film is supplied in a vapor phase in the vicinity of a substrate and is treated in a plasma CVD apparatus to form the insulation film on the substrate by chemical reaction, and the material is further expressed by formula 4.

Furthermore, a material for forming an insulation film is supplied in a vapor phase with either nitrous oxide ($N_2O$) or oxygen ($O_2$) as an oxidizing agent in the vicinity of a substrate and is treated in a plasma CVD apparatus to form said insulation film on said substrate by chemical reaction, and this material can be the compound expressed by formula 5.

Still further, a material for forming an insulation film is supplied in a vapor phase with either nitrous oxide ($N_2O$) or oxygen ($O_2$) as the oxidizing agent in the vicinity of a substrate and is treated in a plasma CVD apparatus to form said insulation film on said substrate by chemical reaction, and this material further can be the compound expressed by formula 6.

Residence Time and Gas Flow

The residence time of the reaction gas is determined based on the capacity of the reaction chamber for the reaction, the pressure adapted for the reaction, and the total flow of the reaction gas. In an embodiment, the reaction pressure is in the range of 1 mTorr-20 Torr; in another embodiment, 1–10 Torr, preferably 3–7 Torr, so as to maintain stable plasma. This reaction pressure is relatively high in order to lengthen the residence time of the reaction gas. The total flow of the reaction gas is important to reducing the relative dielectric constant of a resulting film. It is not necessary to control the ratio of the material gas to the additive gas. In general, the longer the residence time, the lower the relative dielectric constant becomes. The material gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the material gas is expected to be included in the reaction gas. That is approximately $1.6 \times 10^3$ sccm per the surface area of the substrate ($m^2$). The total flow can be defined by residence time (Rt). When Rt is defined described below, in an embodiment, Rt is longer than 100 msec, a preferred range of Rt is 200 msec Rt, more preferably 450 msec Rt 5 sec, in the absence of additive gas. In a conventional plasma TEOS, Rt is generally in the range of 10–30 msec.

$$Rt[s] = 9.42 \times 10^7 (Pr \cdot Ts)/(Ps \cdot Tr) r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm)

In the above, the residence time means the average period of time in which gas molecules stay in the reaction chamber. The residence time (Rt) can be calculated at $Rt = \alpha V/S$, wherein V is the capacity of the chamber (cc), S is the flow volume rate of the reaction gas (cc/s), and a is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, $\alpha$ can be estimated as ½. In the above formula, $\alpha$ is ½.

Basic Effects

In this method, the material gas is, in short, a silicon-containing hydrocarbon compound including at least one Si—O bond, at most two O—$C_nH_{2n+1}$ bonds and at least two hydrocarbon groups bonded to the silicon (Si). The method results in an insulation film having a low relative dielectric constant, high thermal stability and high humidity-resistance.

More specifically, the reaction gas can stay in the plasma for a sufficient length of time. As a result, a linear polymer can be formed so that a linear polymer having the basic structure (formula 7), wherein the "n" is 2 or a greater value, forms in a vapor phase. The polymer is then deposited on the semiconductor substrate and forms an insulation film having a micropore porous structure.

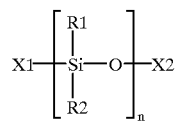
(7)

wherein X1 and X2 are $O_nC_mH_p$ wherein n is 0 or 1, m and p are integers including zero.

The insulation film of this invention has a relatively high stability because its fundamental structure has the Si—O bond having high bonding energy therebetween. Also, its relative dielectric constant is low because it has a micropore porous structure. Further, the fundamental structure (—Si—O—)$_n$ has, on both sides, dangling bonds ending with a hydrocarbon group possessing hydrophobicity, and this property renders the humidity-resistance. Furthermore, the bond of a hydrocarbon group and silicon is generally stable. For instance, both the bond with a methyl group, i.e., Si—$CH_3$, and the bond with a phenyl group, i.e., Si—$C_6H_5$, have a dissociation temperature of 500° C. or higher. Since above semiconductor production requires thermal stability to temperatures above 450° C., that property of the film is advantageous for production of semiconductors.

Further aspects, features and advantages of this invention will become apparent from the detailed description of the preferred examples which follows.

Outline of Example Structures

FIG. 1 diagrammatically shows a plasma CVD apparatus usable in this invention. This apparatus comprises a reaction gas-supplying device 12 and a plasma. CVD device 1. The reaction gas-supplying device 12 comprises plural lines 13, control valves 8 disposed in the lines 13, and gas inlet ports 14, 15 and 16. Further, valves 20 are provided in the lines 13 to open and close the lines 13. A flow controller 7 is connected to the individual control valves 8 for controlling a flow of a material gas of a predetermined volume. A container accommodating liquid reacting material 18 is connected to a vaporizer 17 that vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus of this invention comprises a step of vaporizing silicon-containing hydrocarbon compounds expressed by the general formula $Si_\alpha O_\beta C_x H_y$ ($\alpha$, $\beta$, x, and y are integers) and then introducing them to the reaction chamber 6 of the plasma CVD device 1; a step of introducing an additive gas, whose flow is substantially reduced, into the reaction chamber 6; and also a step of forming an insulation film on a semiconductor substrate by a plasma polymerization reaction wherein mixed gases, made from the silicon-containing hydrocarbon compound as a material gas and the additive gas, are used as a reaction gas. It is a remarkable feature that the reduction of the additive gas flow also renders a substantial reduction of the total flow of the reaction gas. This feature will be described in more detail later.

Material Gas

In an embodiment, the reaction gas includes the silicon-containing hydrocarbon compound expressed as the general formula $Si_\alpha O_\beta C_x H_y$ ($\alpha$, $\beta$, x, and y are integers), preferably a compound having at least one Si—O bond, two or less $O-C_n H_{2n+1}$ bonds and at least two hydrocarbon groups bonded with silicon (Si). More specifically, that is a compound indicated by (A) chemical formula:

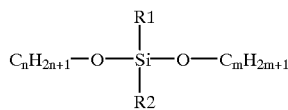

(2)

wherein R1 and R2 are one of $CH_3$, $C_2H_3$, $C_2H_5$, $C_3H_7$ and $C_6H_5$, and m and n are any integers;

a compound indicated by (B) chemical formula:

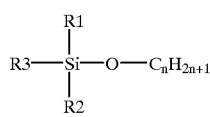

(3)

wherein R1, R2 and R3 are one of $CH_3$, $C_2H_3$, $C_2H_5$, $C_3H_7$ and $C_6H_5$, and integer;

a compound indicated by (C) chemical formula:

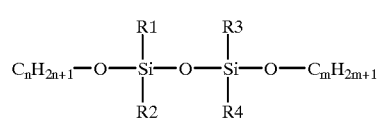

(4)

wherein R1, R2, R3 and R4 are one of $CH_3$, $C_2H_3$, $C_2H_5$, $C_3H_7$ and $C_6H_5$, and m and
n are any integer;

a compound indicated by (D) chemical formula:

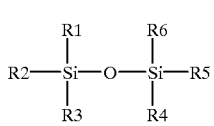

(5)

wherein R1, R2, R3, R4, R5 and R6 are one of $CH_3$, $C_2H_3$, $C_2H_5$; $C_3H_7$ and $C_6H_5$; a compound indicated by (E) chemical formula:

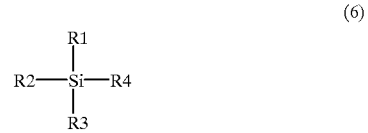

(6)

wherein R1, R2, R3 and R4 are one of $CH_3$, $C_2H_3$, $C_2H_5$, $C_3H_7$ and $C_6H_5$.

Further, it should be noted that the silicon-containing hydrocarbon compound can be any combinations of these compounds and mixtures. In an embodiment, preferably, the compound of formula D can be mixed with at least either compound of formula A or C as a material gas. In another embodiment, the silicon-containing hydrocarbon compound includes at least one compound selected from those of formulas A, B, and C. In another embodiment, the compound of formula E can be mixed with at least either compound of formula A or C as a material gas.

The time in which the material gas stays in the plasma can be lengthened by (i) introducing a minimum quantity of material gas necessary for film formation or deposition (i.e., reducing the total flow of the reaction gas); (ii) increasing the pressure adapted for the reaction; (iii) expanding the reaction space (the capacity of the reaction chamber), and the like. As a result, sufficient polymerizing reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the vaporizer 17 through the line 13. The vaporizer 17 converts the liquid reacting material 18 to the vapor phase which flows into the reaction chamber through the flow controller 7 at a predetermined flow rate to provide a desired volume. If necessary, argon and helium can be supplied through the inlet ports 15 and 16, respectively, and the valve 8 controls the flow volume of these gases, although, in the invention, an additive gas such as argon and helium can be eliminated. The material gas, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, and the space serves as a plasma field. The susceptor 3 continuously heats the semiconductor substrate 4 with the heater 2 and maintains the substrate 4 at a predetermined temperature that is desirably 350–450° C. if the heat resistance required to the film is around 400° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas can be compensated for by eliminating the flow of the additive gas. By lengthening the residence time of the reaction gas, a linear polymer can be deposited sufficiently and subsequently an insulation film having a micropore porous structure can be formed.

Other Aspects

In the above, the silicon-containing hydrocarbon compound to produce a material gas for a silicone polymer has preferably two alkoxy groups or less or having no alkoxy group. The use of a material gas having three or more alkoxy groups interferes with formation of a linear silicone polymer, resulting in a relatively high dielectric constant of a film. In the above, one molecule of the compound preferably contains one, two, or three Si atoms, although the number of Si atoms is not limited (the more the Si atoms, the vaporization becomes more difficult, and the cost of synthesis of the compound becomes higher). The alkoxy group may normally contain 1–3 carbon atoms, preferably one or two carbon atoms. Hydrocarbons bound to Si have normally 1–12 carbon atoms, preferably 1–6 carbon atoms. A preferable silicon-containing hydrocarbon compound has formula:

$$Si_\alpha O_{\alpha-1} R_{2\alpha\beta+2}(OC_n H_{2n+1})_\beta$$

wherein α is an integer of 1–3, β is 0, 1, or 2, n is an integer of 1–3, and R is $C_{1-6}$ hydrocarbon attached to Si.

The target relative dielectric constant is 3.30 or less, preferably 3.10 or less, more preferably 2.80 or less. The appropriate flow can be determined by correlating the relative dielectric constant of the silicone polymer film with the residence time of the reaction gas. The longer the residence time, the lower the dielectric constant becomes. A reduction rate of dielectric constant per lengthened residence time is changeable, and after a certain residence time, the reduction rate of dielectric constant significantly decreases, i.e., the dielectric constant sharply drops after a certain residence time of the reaction gas. After this sharp dielectric constant dropping range, the reduction of the dielectric constant slows down. This is very interesting. In the present invention, by lengthening residence time until reaching the sharp dielectric constant dropping range based on a predetermined correlation between the dielectric constant of the film and the residence time of the reaction gas, it is possible to reduce the relative dielectric constant of the silicone polymer film significantly.

EXAMPLES

Some preferred results in the experiments are described below. In these experiments, PM-DMOS (phenylmethyl dimethoxysilane), DM-DMOS (dimethyl dimethoxysilane, formula 8), and P-TMOS were used as the material gas. An ordinary plasma CVD device (EAGLE-10™, ASM Japan K.K.) was used as an experimental device. The conditions for forming the film are as follows;

RF power supply: 250 W (use the frequency made from 13.56 MHz and 430 kHz by synthesizing them with each other, except for Example 3 wherein 27 MHz was used)

Substrate temperature: 400° C.

Reacting pressure: 7 Torr

The residence time (Rt) is defined with the following formula.

$$Rt[s]=9.42\times10^7(Pr \cdot Ts/Ps \cdot Tr)r_w^2 d/F$$

In this formula, each abbreviation indicates the following parameter.

Pr: reaction chamber pressure (Pa)
Ps: standard atmospheric pressure (Pa)
Tr: average temperature of the reaction gas (K)
Ts: standard temperature (K)
$r_w$: radius of the silicon substrate (m)
d: space between the silicon substrate and the upper electrode (m)
F: total flow volume of the reaction gas (sccm)

Individual parameters were fixed at the following values; only the flow volume was varied so as to find out the relationship between the flow volume and the relative dielectric constant.

Pr=9.33×10² (Pa)
Ps=1.01×10⁵ (Pa)
Tr=273+400=673 (K)
Ts=273 (K)
$r_w$=0.1 (m)
d=0.014 (m)

Table 1 lists comparative examples and present invention's examples.

TABLE 1

| | Material Gas Flow (sccm) | Ar (sccm) | He (sccm) | Reaction Gas Total Flow (sccm) | Rt (msec) | Relative dielectric constant ∈ |
|---|---|---|---|---|---|---|
| C.Ex. 1 (PM-DMOS) | 100 | 775 | 775 | 1650 | 30 | 3.41 |
| C.Ex. 2 (PM-DMOS) | 100 | 550 | 550 | 1200 | 41 | 3.41 |
| C.Ex. 3 (PM-DMOS) | 100 | 430 | 430 | 960 | 51 | 3.40 |
| C.Ex. 4 (PM-DMOS) | 100 | 310 | 310 | 720 | 68 | 3.35 |
| C Ex. 5 (PM-DMOS) | 100 | 140 | 140 | 480 | 103 | 3.10 |
| C Ex. 6 (PM-DMOS) | 100 | 100 | 100 | 300 | 165 | 2.76 |
| C Ex. 7 (PM-DMOS) | 100 | 70 | 70 | 240 | 206 | 2.64 |
| C Ex. 8 (PM-DMOS) | 100 | 10 | 10 | 120 | 412 | 2.45 |
| Ex. 1 | 100 | 0 | 0 | 100 | 494 | 2.43 |
| Ex. 2 | 50 | 0 | 0 | 50 | 988 | 2.55 |
| Ex. 3 (27 MHz) | 50 | 0 | 0 | 50 | 988 | 2.56 |

Comparative Example 1

Material gas: PM-DMOS (100 sccm)

Additive gases: Ar (775 sccm) and He (775 sccm)

Total flow volume of reaction gas: 1650 sccm

Other conditions and devices used for forming the film are given above. The calculated value of the residence time Rt was 30 msec. The conditions in this example reduced the relative dielectric constant ∈ of the insulation film to 3.41.

Comparative Example 2

Material gas: PM-DMOS (100 sccm)

Additive gases: Ar (550 sccm) and He (550 sccm)

Total flow volume of reaction gas: 1200 sccm

Other conditions and devices used for forming the film are given above. The calculated value of the residence time Rt was 41 msec. The conditions in this example reduced the relative dielectric constant ∈ of the insulation film to 3.41.

Comparative Example 3

Material gas: PM-DMOS (100 sccm)

Additive gas: Ar (430 sccm) and He (430 sccm)

Total flow volume of reaction gas: 960 sccm

Other conditions and devices used for forming the film are given above. The calculated value of the residence time Rt was 51 msec. The conditions in this example reduced the relative dielectric constant ∈ of the insulation film to 3.40.

Comparative Example 4

Material gas: PM-DMOS (100 sccm)

Additive gases: Ar (310 sccm) and He (310 sccm)

Total flow volume of reaction gas: 720 sccm

Other conditions and devices used for forming the film are given above. The calculated value of the residence time Rt was 68 msec. The conditions in this example reduced the relative dielectric constant ∈ of the insulation film to 3.35.

Comparative Example 5

Material gas: PM-DMOS (100 sccm)

Additive gases: Ar (140 sccm) and He (140 sccm)

Total flow volume of reaction gas: 480 sccm

Other conditions and devices used for forming the film are given above. The calculated value of the residence time Rt was 103 msec. The conditions in this example reduced the relative dielectric constant ∈ of the insulation film to 3.10.

Comparative Example 6

Material gas: PM-DMOS (100 sccm)

Additive gases: Ar (100 sccm) and He (100 sccm)

Total flow volume of reaction gas: 300 sccm

Other conditions and devices used for forming the film are given above. The calculated value of the residence time Rt was 165 msec. The conditions in this example reduced the relative dielectric constant ∈ of the insulation film to 2.76.

Comparative Example 7

Material gas: PM-DMOS (100 sccm)

Additive gases: Ar (70 sccm) and He (70 sccm)

Total flow volume of reaction gas: 240 sccm

Other conditions and devices used for forming the film are given above. The calculated value of the residence time Rt was 206 msec. The conditions in this example reduced the relative dielectric constant ∈ of the insulation film to 2.64.

Comparative Example 8

Material gas: PM-DMOS (100 sccm)

Additive gases: Ar (10 sccm) and He (10 sccm)

Total flow volume of reaction gas: 120 sccm

Other conditions and devices used for forming the film are given above. The calculated value of the residence time Rt was 412 msec. The conditions in this example reduced the relative dielectric constant ∈ of the insulation film to 2.45.

Example 1

Material gas: PM-DMOS (100 sccm)

Additive gases: none

Total flow volume of reaction gas: 100 sccm

Other conditions and devices used for forming the film are given above. The calculated value of the residence time Rt was 494 msec. The conditions in this example reduced the relative dielectric constant ∈ of the insulation film to 2.43.

Figure 2:
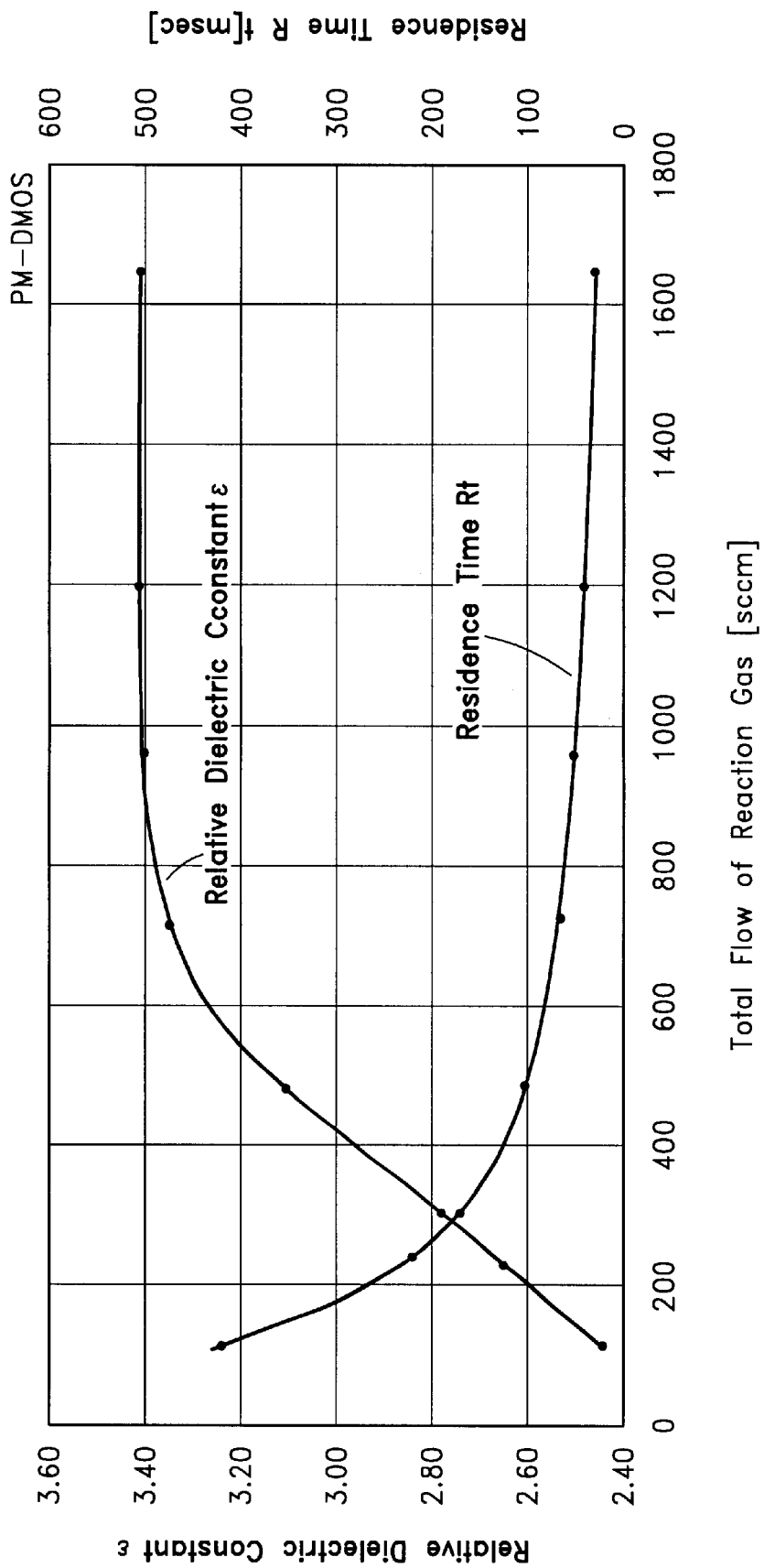
FIG. 2 is a graph showing the relationship between relative dielectric constant and the total flow of a reaction gas as well as the relationship between residence time and the total flow of a reaction gas, both in experiments using PM-DMOS (phenylmethyl dimethoxysilane) as a material gas.
Figure 3:
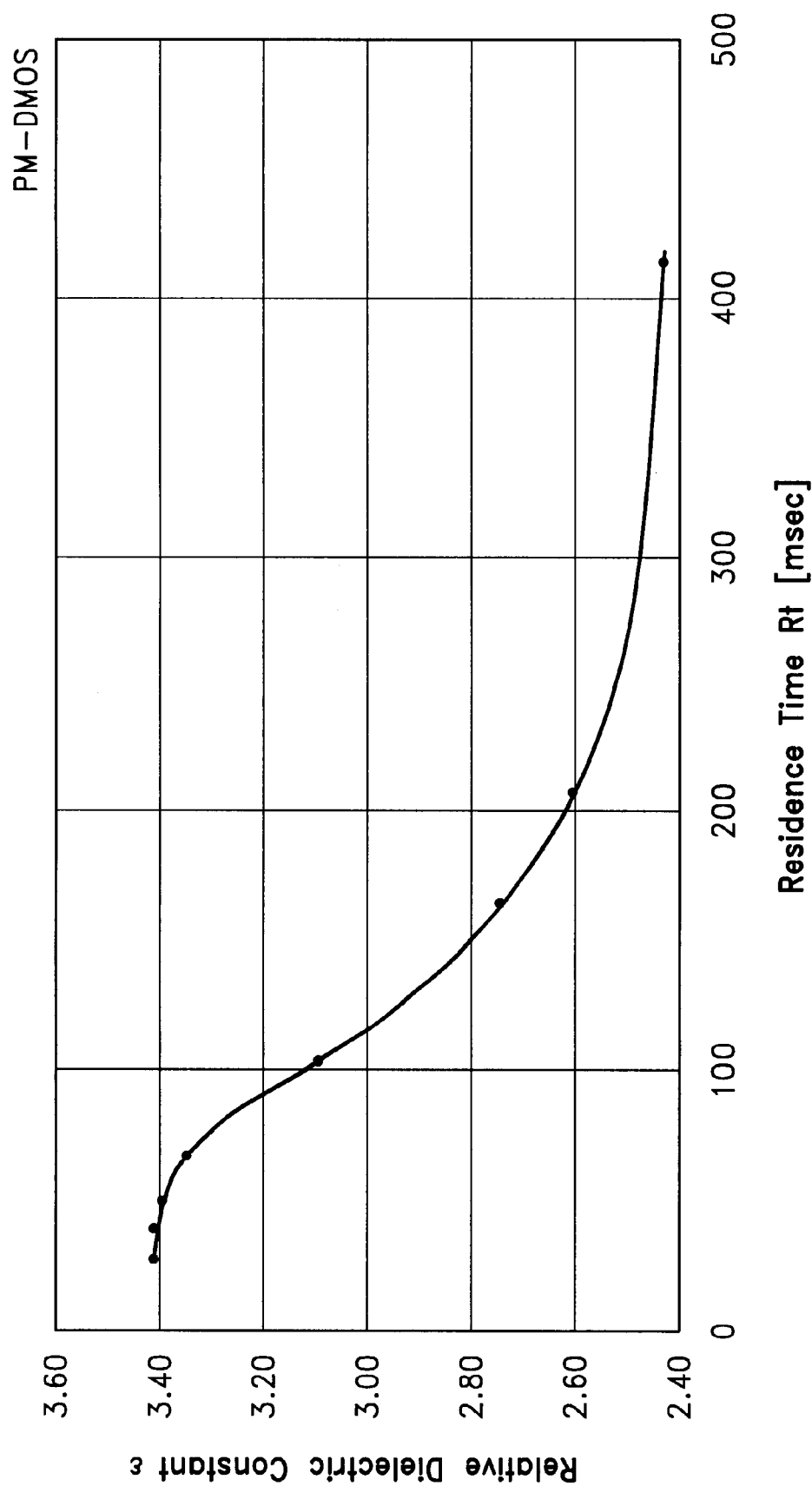
FIG. 3 is a graph showing the relationship between the residence time and relative dielectric constant in experiments using PM-DMOS as a material gas.

Hereinafter, the results given above will be examined with reference to FIGS. 2 and 3. FIG. 2 is a graph showing the relationship between the relative dielectric constant ∈ and the total flow volume of the reaction gas as well as the relationship between the residence time Rt and the total flow volume of the reaction gases, in the experiments using PM-DMOS as a material gas. FIG. 3 is a graph showing the relationship between the residence time Rt and the relative dielectric constant ∈ in the experiments using PM-DMOS as a material gas.

First, the relationship between the flow volume of the PM-DMOS gases and the relative dielectric constant ∈ of the insulation film will be examined. FIG. 2 shows that the relative dielectric constant ∈ is almost constantly 3.4 when the flow volume is about 900 sccm or higher. However, the relative dielectric constant ∈ begins to fall with the decrease of the flow volume, with a major change in the slope at approximately 700 sccm. Further, as the flow volume falls to under 500 sccm, the residence time Rt rises drastically and the relative dielectric constant ∈ falls drastically. Meanwhile, FIG. 3 shows that the relative dielectric constant ∈ begins to decrease when the residence time Rt increases from approximately 70 msec. When the residence time Rt is greater than 400 msec, the relative dielectric constant ∈ falls to 2.45.

Thus, these present invention's examples apparently indicate that if the total flow of the reaction gas of the PM-DMOS gas and the additive gas is controlled so that Rt is more than 100 msec the relative dielectric constant ∈ can be controlled to be less than 3.1.

Example 2

DM-DMOS (formula 8) was then tested.

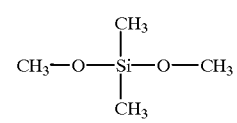

(8)

Material gas: PM-DMOS (50 sccm)

Additive gases: none

Total flow volume of reaction gas: 50 sccm

Other conditions and devices used for forming the film are given above. The calculated value of the residence time Rt was 988 msec. The conditions in this example reduced the relative dielectric constant ∈ of the insulation film to 2.55.

Example 3

RF frequency: 27 MHz only

Material gas: PM-DMOS (50 sccm)

Additive gases: none

Total flow volume of reaction gas: 50 sccm

Other conditions and devices used for forming the film are given above. The calculated value of the residence time Rt was 988 msec. The conditions in this example reduced the relative dielectric constant ∈ of the insulation film to 2.56.

Thus, the above reveals that, in the material gas of formula 2, both compounds (PM-DMOS having $C_6H_5$ at R1 and $CH_3$ at R2 and DM-DMOS having $CH_3$ at R1 and $CH_3$ at R2) can produce insulation films having a very low relative dielectric constant (∈<3.1).

The following will examine if the P-TMOS gas replacing the PM-DMOS gas can render the same results. In comparison to the above Comparative Examples, experimental examples were conducted using the P-TMOS as a material gas. These examples indicate that the relative dielectric constant does not decrease even when the total flow of the reaction gas is reduced to 5.7%. Thus, the relationship between the flow volume and the relative dielectric constant that is effected with PM-DMOS does not come into effect with P-TMOS.

Further, the following will examine differences of relative dielectric constant when using different material gases. Comparing an experimental example using P-TMOS and Comparative Example 8, although the flow volumes and other conditions are identical, the relative dielectric constant $\in$ of P-TMOS is 3.42 while the relative dielectric constant F of PM-DMOS is 2.45. Such a large difference between the relative dielectric constant values resides in the difference in the molecular structures of the material gases. That is, PM-DMOS has a pair of relatively unstable O—CH$_3$ bonds which are prone to separation so that polymerization reactions occur and a linear polymer (formula 7) forms in a gaseous state. This polymer is deposited on a semiconductor substrate, forming a micropore porous structure and subsequently the relative dielectric constant of the insulation film decreases. In contrast, because P-TMOS has three O—CH$_3$ bonds, its polymer is not deposited linearly even though the residence time is lengthened. Accordingly, the deposited film does not have the micropore porous structure nor such a low relative dielectric constant.

These experiment have reealed that it is preferable that the silicon-containing hydrocarbon compounds used as the material gases should have not only the Si—O bonds but also at most two O—C$_n$H$_{2n+1}$ bonds and, further, at least two hydrocarbon groups bonded to the silicon (Si).

Film stability characteristics of low relative dielectric constant films formed according to the present invention were evaluated by preparing low relative dielectric constant films according to Example 1, wherein PM-DMOS was used, and Examples 2 and 3, wherein DM-DMOS was used, thereby evaluating their stability of relative dielectric constant and their thermal stability.

(1) Stability of Relative dielectric constant

Changes in relative dielectric constant of the films were measured upon heating and humidifying the PM-DMOS film and the DM-DMOS film in a pressure cooker. That is, each film was formed on a Si wafer at a thickness of 1 µm, and its relative dielectric constant was measured upon formation of the film and after being placed at 120° C. and 100% humidity for one hour. The results are shown below. No change in relative dielectric constant of each film was detected, i.e., indicating high stability characteristics.

TABLE 2

Relative dielectric constant

| | Material Gas | Upon Formation | One Hour at High Temp. and Humid. |
|---|---|---|---|
| Example 1 | PM-DMOS | 2.43 | 2.43 |
| Example 2 | DM-DMOS | 2.55 | 2.55 |
| Example 3 | DM-DMOS | 2.56 | 2.56 |

As described above, the method of this invention using the silicon-containing hydrocarbon compounds of this invention as the material gases produces an insulation film that has high thermal stability, high humidity-resistance and a low relative dielectric constant. Additionally, it is found that controlling the residence time of the reaction gas can effectively and easily control the relative dielectric constant of the film. Further, the method of this invention actualizes easy production of insulation films without using expensive devices. By eliminating the use of additive gas, the apparatus can be simplified.

Although this invention has been described in terms of certain examples, other examples apparent to those of ordinary skill in the art are within the scope of this invention. Accordingly, the scope of the invention is intended to be defined only by the claims that follow.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicone polymer insulation film on a semiconductor substrate by plasma treatment, comprising the steps of:

introducing a material gas with no additive gas into a reaction chamber for plasma CVD processing wherein a semiconductor substrate is placed, said material gas comprising a silicon-containing hydrocarbon having two alkoxy groups or less or having no alkoxy group; and forming a silicone polymer fin having —SR$_2$O— repeating structural units on the semiconductor substrate by activating a plasma polymerization reaction in the reaction chamber where the material gas is present, while controlling the flow of the material gas to lengthen a residence time, Rt, of the material gas in the reaction chamber until the relative dielectric constant of the silicone polymer film is lower than a predetermined value, wherein 100 msec $\leq$ Rt, $$Rt[s]=9.42\times10^7(Pr\cdot Ts/Ps\cdot Tr)r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume rate of the reaction gas (sccm).

2. The method according to claim 1, wherein the residence time is determined by correlating the relative dielectric constant with the residence time.

3. The method according to claim 1, wherein the alkoxy group present in the silicon-containing hydrocarbon compound has 1 to 3 carbon atoms.

4. The method according to claim 1, wherein the hydrocarbon present in the silicon-containing hydrocarbon compound has 1 to 6 carbon atoms.

5. The method according to claim 1, wherein the silicon-containing hydrocarbon compound has 1 to 3 silicon atoms.

6. The method according to claim 1, wherein the silicon-containing hydrocarbon compound has a formula of Si$_\alpha$O$_{\alpha-1}$R$_{2\alpha-\beta+2}$(OC$_n$H$_{2n+1}$)$_\beta$ wherein $\alpha$ is an integer of 1–3, $\beta$ is 0, 1, or 2, n is an integer of 1–3, and R is a C$_{1-6}$ hydrocarbon attached to Si.

7. The method according to claim 1, wherein the silicon-containing hydrocarbon compound is selected from the group consisting of:

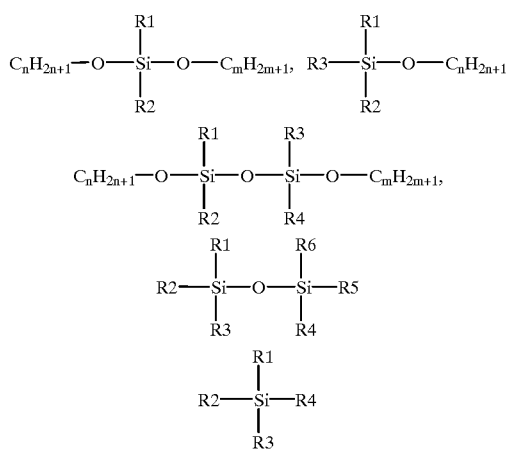

wherein R1, R2, R3, R4, R5, and R6 are independently $CH_3$, $C_2H_3$, $C_2H_5$, $C_3H_7$ or $C_6H_5$, and m and n are integers of 1–6.

8. The method according to claim 1, wherein the flow of the material gas is controlled to render the relative dielectric constant of the silicone polymer film lower than 3.30.

9. The method according to claim 1, wherein the reaction gas is selected to form a —Si—O—Si— bone structure with methyl groups in the silicone polymer film.

10. The method according to claim 1, wherein the flow of the material gas is controlled to render the relative dielectric constant of the silicone polymer film lower than 2.80.

11. The method according to claim 1, wherein Rt is no less than 200 msec.

12. The method according to claim 1, wherein Rt is no less than 450 msec.

* * * * *